United States Patent
Lin et al.

(10) Patent No.: US 10,964,828 B2
(45) Date of Patent: Mar. 30, 2021

(54) BIFACIAL P-TYPE PERC SOLAR CELL AND MODULE, SYSTEM, AND PREPARATION METHOD THEREOF

(71) Applicants: Guangdong Aiko Solar Energy Technology Co., Ltd., Guangdong (CN); Zhejiang Aiko Solar Energy Technology Co., Ltd., Yiwu (CN)

(72) Inventors: Kang-Cheng Lin, Foshan (CN); Jiebin Fang, Foshan (CN); Gang Chen, Foshan (CN)

(73) Assignees: Guangdong Aiko Solar Energy Technology Co., Ltd., Guangdong (CN); Zhejiang Aiko Solar Energy Technology Co., Ltd., Yiwu (CN)

( * ) Notice: Subject to any disclaimer, the term of this patent is extended or adjusted under 35 U.S.C. 154(b) by 0 days.

(21) Appl. No.: 16/489,670

(22) PCT Filed: Feb. 28, 2018

(86) PCT No.: PCT/CN2018/077591
§ 371 (c)(1),
(2) Date: Aug. 28, 2019

(87) PCT Pub. No.: WO2018/157824
PCT Pub. Date: Sep. 7, 2018

(65) Prior Publication Data
US 2020/0119208 A1   Apr. 16, 2020

(30) Foreign Application Priority Data
Mar. 3, 2017 (CN) .......................... 201710122400.3

(51) Int. Cl.
*H01L 31/0224* (2006.01)
*H01L 31/0236* (2006.01)
(Continued)

(52) U.S. Cl.
CPC ................ *H01L 31/022433* (2013.01); *H01L 31/02366* (2013.01); *H01L 31/0684* (2013.01); *H01L 31/1804* (2013.01); *H01L 31/1868* (2013.01)

(58) Field of Classification Search
None
See application file for complete search history.

(56) References Cited

U.S. PATENT DOCUMENTS

2005/0224788 A1   10/2005   Hsu et al.

FOREIGN PATENT DOCUMENTS

| CN | 203883015 U | 10/2014 |
| CN | 203983300 U | 12/2014 |

(Continued)

OTHER PUBLICATIONS

Machine Translation CN 106711239A, accessed Nov. 7, 2020 (Year: 2017).*

(Continued)

*Primary Examiner* — Shannon M Gardner
(74) *Attorney, Agent, or Firm* — Seed IP Law Group LLP (57) ABSTRACT

Provided are a bifacial P-type PERC solar cell, preparation method, module and system. The bifacial P-type PERC solar cell consecutively comprises a rear silver electrode (1), rear aluminum grid lines (2), a rear passivation layer (3), P-type silicon (4), an N-type emitter (5), a front silicon nitride film (6), and a front silver electrode (7); the rear silver electrode (1) is perpendicularly connected with the rear aluminum grid lines (2), grid line backbones (10) are disposed on the rear aluminum grid lines (2), an outer aluminum grid frame (9) is disposed around the rear aluminum grid lines (2), the grid line backbones (10) are connected with the rear aluminum grid lines (2), and the outer aluminum grid frame (9) is connected with the rear aluminum grid lines (2) and the rear (Continued)

silver electrode (1); a first laser grooving region (8) is formed in the rear passivation layer (3) with laser grooving, and the rear aluminum grid lines (2) are connected to the P-type silicon (4) via the first laser grooving region (8); the first laser grooving region (8) includes a plurality of sets of first laser grooving units (81) arranged horizontally, each of the sets of first laser grooving units (81) includes one or more first laser grooving bodies (82) arranged horizontally, and the rear aluminum grid lines (2) are perpendicular to the first laser grooving bodies (82). The solar cell is simple in structure, low in cost and easy to popularize, and has a high photoelectric conversion efficiency.

7 Claims, 4 Drawing Sheets

(51) Int. Cl.
*H01L 31/068* (2012.01)
*H01L 31/18* (2006.01)

(56) References Cited

FOREIGN PATENT DOCUMENTS

| | | | |
|---|---|---|---|
| CN | 106057925 A | * | 10/2016 |
| CN | 106098839 A | | 11/2016 |
| CN | 106252445 A | | 12/2016 |
| CN | 106449834 A | | 2/2017 |
| CN | 106711239 A | * | 5/2017 |
| CN | 106887475 A | | 6/2017 |
| DE | 202015004065 U1 | | 9/2015 |
| DE | 102014105358 A | | 10/2015 |
| DE | 102015104236 A1 | | 9/2016 |

OTHER PUBLICATIONS

Machine Translation CN 106057925A, accessed Nov. 7, 2020 (Year: 2015).*
International Search Report, dated May 28, 2018, for International Application No. PCT/CN2018/077591, 6 pages. (with English translation).

* cited by examiner

BIFACIAL P-TYPE PERC SOLAR CELL AND MODULE, SYSTEM, AND PREPARATION METHOD THEREOF

FIELD OF THE DISCLOSURE

The present invention relates to the field of solar cells, and in particular to a bifacial P-type PERC solar cell, a method of preparing the bifacial P-type PERC solar cell, a solar cell module that employs the bifacial P-type PERC solar cell, and a solar system that employs the bifacial P-type PERC solar cell.

BACKGROUND OF THE DISCLOSURE

A crystalline silicon solar cell is a device that effectively absorbs solar radiation energy and converts light energy into electrical energy through the photovoltaic effect. When sunlight reaches the p-n junction of a semiconductor, new electron-hole pairs are generated. Under the action of the electric field of the p-n junction, the holes flow from the N zone to the P zone, and the electrons flow from the P zone to the N zone, generating current upon switching on a circuit.

In a conventional crystalline silicon solar cell, surface passivation is basically only performed at the front surface, which involves depositing a layer of silicon nitride on the front surface of the silicon wafer via PECVD to reduce the recombination rate of the minority carriers at the front surface. As a result, the open-circuit voltage and short-circuit current of the crystalline silicon cell can be greatly increased, which leads to an increase of the photoelectric conversion efficiency of the crystalline silicon solar cell. However, as passivation is not provided at the rear surface of the silicon wafer, the increase in photoelectric conversion efficiency is still limited.

The structure of an existing bifacial solar cell is as follows: the substrate is an N-type silicon wafer; when photons from the sun reach the rear surface of the cell, the carriers generated in the N-type silicon wafer pass through the silicon wafer, which has a thickness of about 200 µm; as in an N-type silicon wafer, the minority carriers have a long lifetime and carrier recombination rate is low, some carriers are able to reach the p-n junction at the front surface; the front surface of the solar cell is the main light-receiving surface, and its conversion efficiency accounts for a high proportion of the conversion efficiency of the whole cell; as a result of overall actions at both the front surface and the rear surface, the conversion efficiency of the cell is significantly increased. However, the price of an N-type silicon wafer is high, and the process of manufacturing a bifacial N-type cell is complicated. Therefore, a hotspot for enterprises and researchers is to how to develop a bifacial solar cell with high efficiency and low cost.

On the other hand, in order to meet the ever-rising requirements for the photoelectric conversion efficiency of crystalline silicon cells, the industry has been researching rear-surface passivation techniques for PERC solar cells. Mainstream manufacturers in the industry are mainly developing monofacial PERC solar cells. The present invention combines a highly efficient PERC cell and a bifacial cell to develop a bifacial PERC solar cell that has overall higher photoelectric conversion efficiency.

Bifacial PERC solar cells have higher usage values in the practical applications as they have high photoelectric conversion efficiency while they absorb solar energy on both sides to generate more power. Thus, the present invention aims to provide a bifacial P-type PERC solar cell which is simple to manufacture, low in cost, easy to popularize, and has a high photoelectric conversion efficiency.

SUMMARY OF THE DISCLOSURE

An objective to be addressed by the present invention is to provide a bifacial P-type PERC solar cell which is simple in structure, low in cost, easy to popularize, and has a high photoelectric conversion efficiency.

Another objective to be addressed by the present invention is to provide a method of preparing the bifacial P-type PERC solar cell, which is simple in process, low in cost, easy to popularize, and has a high photoelectric conversion efficiency.

Yet another objective to be addressed by the present invention is to provide a bifacial P-type PERC solar cell module which is simple in structure, low in cost, easy to popularize, and has a high photoelectric conversion efficiency.

Still another objective to be addressed by the present invention is to provide a bifacial P-type PERC solar system which is simple in structure, low in cost, easy to popularize, and has a high photoelectric conversion efficiency.

To address the objectives above, the present disclosure provides a bifacial P-type PERC solar cell which consecutively comprises a rear silver electrode, rear aluminum grid lines, a rear passivation layer, P-type silicon, an N-type emitter, a front silicon nitride film, and a front silver electrode, wherein the rear silver electrode is perpendicularly connected with the rear aluminum grid lines, grid line backbones are disposed on the rear aluminum grid lines, an outer aluminum grid frame is disposed around the rear aluminum grid lines, the grid line backbones are connected with the rear aluminum grid lines, and the outer aluminum grid frame is connected with the rear aluminum grid lines and the rear silver electrode;

the rear aluminum grid lines may also be in a curved shape, an arc shape, a wavy shape, etc.

A first laser grooving region is formed in the rear passivation layer by laser grooving, and the rear aluminum grid lines are connected to the P-type silicon via the first laser grooving region;

the first laser grooving region includes a plurality of sets of first laser grooving units arranged horizontally, each of the sets of first laser grooving units includes one or more first laser grooving bodies arranged horizontally, and the rear aluminum grid lines are perpendicular to the first laser grooving bodies.

As a preferred example of the above embodiments, a second laser grooving region is disposed below the outer aluminum grid frame, the second laser grooving region includes second laser grooving units that are arranged vertically or horizontally, each set of second laser grooving units includes one or more second laser grooving bodies that are arranged vertically or horizontally, and the outer aluminum grid frame is perpendicular to the second laser grooving bodies.

As a preferred example of the above embodiments, the grid line backbones are perpendicularly connected with the rear aluminum grid lines;

a third laser grooving region is disposed below the grid line backbones, the third laser grooving region includes a plurality of sets of third laser grooving units, each of the sets of third laser grooving units includes one or more third laser grooving bodies arranged vertically, the third laser grooving bodies are perpendicular to the grid line backbones, and the grid line backbones are connected to the P-type silicon via the third laser grooving bodies.

As a preferred example of the above embodiments, the first laser grooving units are arranged in parallel; in each of the first laser grooving units, the first laser groove bodies are arranged side by side, and in the same horizontal plane or staggered up and down;

spacing between the first laser grooving units is 0.5-50 mm;

in each of the first laser grooving units, spacing between the first laser grooving bodies is 0.5-50 mm;

the first laser grooving bodies each have a length of 50-5000 μm and a width of 10-500 μm.

As a preferred example of the above embodiments, the number of the rear aluminum grid lines is 30-500, and the number of the grid line backbones is 30-500;

the rear aluminum grid lines each have a width of 30-500 μm which is smaller than the length of each of the first laser grooving bodies;

the grid line backbones each have a width of 30-500 μm which is smaller than a length of each of the third laser grooving bodies.

As a preferred example of the above embodiments, a pattern of each of the grid line backbones is a continuous straight line or a dashed line composed of a plurality of line segments;

the grid line backbones are made of silver paste and each have a width of 30-60 μm; or the grid line backbones are made of aluminum paste and each have a width of 50-500 μm.

Accordingly, the present disclosure further discloses a method of preparing a bifacial P-type PERC solar cell, comprising:

(1) forming textured surfaces at a front surface and a rear surface of a silicon wafer, the silicon wafer being P-type silicon;

(2) performing diffusion on the silicon wafer to form an N-type emitter;

(3) removing phosphosilicate glass on the front surface and peripheral p-n junctions formed during the diffusion;

(4) depositing an aluminum oxide film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form a first laser grooving region, wherein the first laser grooving region includes a plurality of sets of first laser grooving units horizontally arranged, and each of the sets of the first laser grooving units includes one or more first laser grooving bodies arranged horizontally;

(8) printing a rear silver busbar electrode on the rear surface of the silicon wafer;

(9) printing aluminum paste in a direction perpendicular to a laser grooving direction on the rear surface of the silicon wafer to obtain rear aluminum grid lines, the rear aluminum grid lines being perpendicular to the first laser grooving bodies, and printing aluminum paste around the rear aluminum grid lines to obtain an outer aluminum grid frame;

(10) printing grid line backbones on the rear surface of the silicon wafer;

(11) printing front electrode paste on the front surface of the silicon wafer;

(12) sintering the silicon wafer at a high temperature to form a rear silver electrode and a front silver electrode;

(13) performing anti-LID annealing on the silicon wafer.

As a preferred example of the above embodiments, between the steps (3) and (4), the method further comprises polishing the rear surface of the silicon wafer.

As a preferred example of the above embodiments, the step (7) further comprises:

performing laser grooving in the rear surface of the silicon wafer to form a second laser grooving region and a third laser grooving region;

wherein the second laser grooving region includes second laser grooving units that are arranged vertically or horizontally, each set of second laser grooving units includes one or more second laser grooving bodies that are arranged vertically or horizontally; and the second laser grooving bodies are perpendicular to the outer aluminum grid frame;

wherein the third laser grooving region includes a plurality of sets of third laser grooving units, each of the sets of third laser grooving units includes one or more third laser grooving bodies arranged vertically, and the third laser grooving bodies are perpendicular to the grid line backbones.

Accordingly, the present disclosure further discloses a PERC solar cell module, which comprises a PERC solar cell and a packaging material, wherein the PERC solar cell is any one of the bifacial P-type PERC solar cells described above.

Accordingly, the present disclosure further discloses a PERC solar system, which comprises a PERC solar cell, wherein the PERC solar cell is any one of the bifacial P-type PERC solar cells described above.

The following beneficial effects can be achieved by implementing the present disclosure.

In the present disclosure, the rear aluminum grid lines are achieved by forming the rear passivation layer on the rear surface of the silicon wafer, subsequently forming the first laser grooving region in the rear passivation layer with laser grooving, and then printing aluminum paste in the direction perpendicular to the laser scribing direction, such that the aluminum paste is connected with the P-type silicon via the grooving region. By fabricating the cell grid line structures on the front surface and the rear surface of the silicon wafer, the bifacial PERC solar cell may employ a method different from the conventional one for printing the aluminum paste. As the width of the aluminum grid is much smaller than the length of the first laser grooving region, it is unnecessary to perform precise alignment of the aluminum paste and the first laser grooving region, which simplifies the laser process and the printing process, lowers the difficulty in debugging the printing device and is easy to scale-up for industrial production. Furthermore, the first laser grooving region that is not covered by the aluminum paste may increase sunlight absorption at the rear surface of the cell, thus increasing the photoelectric conversion efficiency of the cell.

In addition, during printing, due to a high viscosity of the aluminum paste and a narrow line width of the printing screen, a broken aluminum grid line occurs occasionally. The broken aluminum grid would lead to a black broken grid line in an image of EL test. Meanwhile, the broken aluminum grid line will also affect the photoelectric conversion efficiency of the cell. For this reason, in the present disclosure, the grid line backbones are additionally provided at the rear aluminum grid lines and the outer aluminum grid frame is disposed around the rear aluminum grid lines, wherein the grid line backbones are connected with the rear aluminum grid lines, and the outer aluminum grid frame is connected with the rear aluminum grid lines and the rear silver electrode, so as to additionally provide a plurality of paths for the flow of electrons, prevent the broken aluminum grid line from affecting the photoelectric conversion efficiency of the cells, and meanwhile avoid the broken grid line in the EL test of the cells.

The second laser grooving region may be disposed below the outer aluminum grid frame, and the third laser grooving region may be disposed below the grid line backbones. It is unnecessary to perform precise alignment of the paste with the second and third laser grooving regions, which simplifies the laser process and the printing process and lowers the difficulty in debugging the printing device. Furthermore, the second and third laser grooving regions that are not covered by the paste may increase sunlight absorption at the rear surface of the cells, and thus improve the photoelectric conversion efficiency of the cells.

Therefore, the present disclosure is simple in structure, simple in process, low in cost and easy to popularize, and has a high photoelectric conversion efficiency.

DETAILED DESCRIPTION OF THE ILLUSTRATED EMBODIMENTS

To more clearly illustrate the objectives, technical solutions and advantages of the present invention, the present invention will be further described in detail below with reference to the accompanying drawings.

An existing monofacial solar cell is provided at the rear side of the cell with an all-aluminum back electric field covering the entire rear surface of a silicon wafer. The all-aluminum back electric field functions to increase the open-circuit voltage Voc and the short-circuit current Jsc, force the minority carriers away from the surface, and decrease the recombination rate of the minority carriers, so as to increase the cell efficiency as a whole. However, as the all-aluminum back electric field is opaque, the rear side of the solar cell, which has the all-aluminum back electric field, cannot absorb light energy, and light energy can only be absorbed at the front side. The overall photoelectric conversion efficiency of the cell can hardly be improved significantly.

Figure 1:
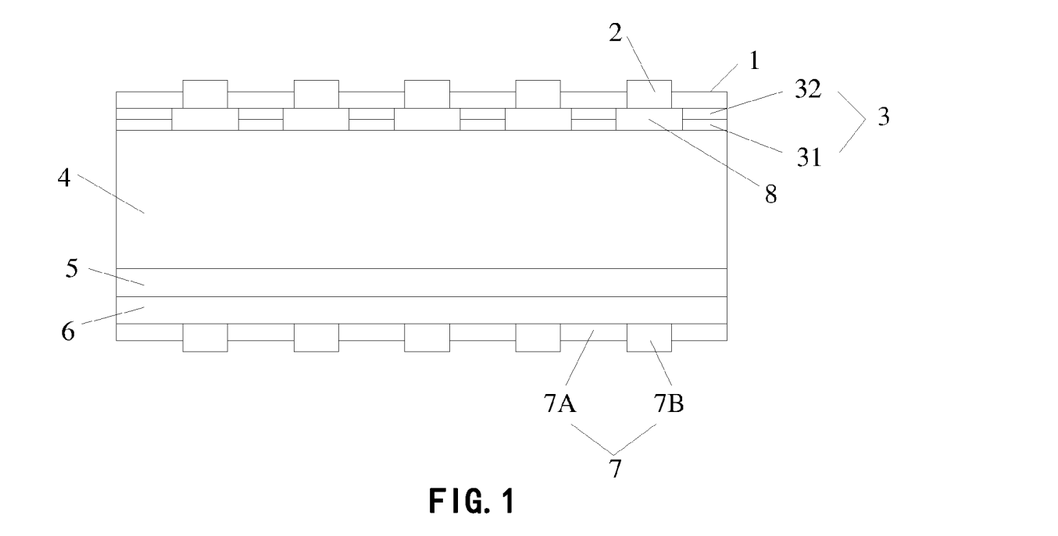
FIG. 1 is a sectional view of a bifacial P-type PERC solar cell according to the present disclosure.

In view of the technical problem above, referring to FIG. 1, the present disclosure provides a bifacial P-type PERC solar cell, which consecutively includes a rear silver electrode 1, rear aluminum grid lines 2, a rear passivation layer 3, P-type silicon 4, an N-type emitter 5, a front silicon nitride film 6, and a front silver electrode 7, wherein the rear silver electrode 1 is perpendicularly connected with the rear aluminum grid lines 2, grid line backbones 10 are disposed at the rear aluminum grid lines 2, and the grid line backbones 10 are connected with the rear aluminum grid lines 2. An outer aluminum grid frame 9 is disposed around the rear aluminum grid lines, and the outer aluminum grid frame 9 is connected with the rear aluminum grid lines 2 and the rear silver electrode 1.

A first laser grooving region 8 is formed in the rear passivation layer 3 by laser grooving. The rear aluminum grid lines 2 are connected to the P-type silicon 4 via the first laser grooving region 8. The front silver electrode 7 includes a front silver electrode busbar 7A and a front silver electrode finger 7B. The rear passivation layer 3 includes an aluminum oxide layer 31 and a silicon nitride layer 32.

The present invention improves the existing monofacial PERC solar cells and provides many rear aluminum grid lines 2 in replacement of the all-aluminum back electric field. First laser grooving regions 8 are provided in the rear passivation layer 3 with a laser grooving technique, and the rear aluminum grid lines 2 are printed on these parallel-arranged first laser grooving regions 8 to be in local contact with the P-type silicon 4. The rear aluminum grid lines 2 arranged in dense and parallel manner can play a role of increasing the open-circuit voltage Voc and the short-circuit current Jsc, reducing the recombination rate of the minority carriers, and thus enhancing the photoelectric conversion efficiency of the cell, to replace the all-aluminum back electric field in the existing monofacial cell structure. Moreover, since the rear surface of the silicon wafer is not completely covered by the rear aluminum grid lines 2, sunlight can be projected into the silicon wafer between the rear aluminum grid lines 2. Accordingly, the rear surface of the silicon wafer can absorb the light energy, which greatly improves the photoelectric conversion efficiency of the cell.

Figure 2:
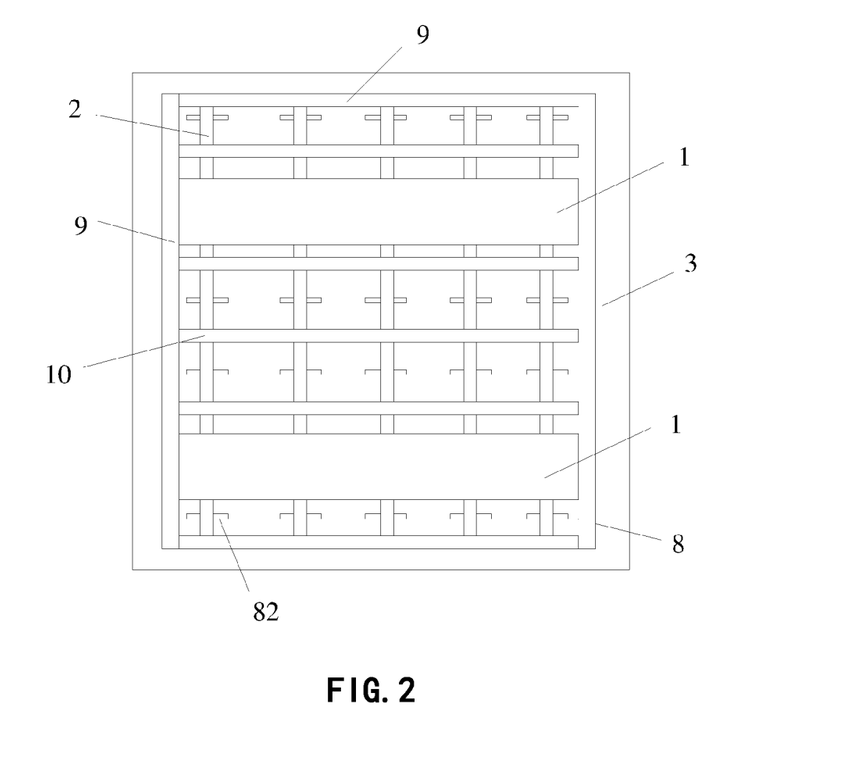
FIG. 2 is a schematic view of a first embodiment of a rear surface structure of a bifacial P-type PERC solar cell according to the present disclosure.
Figure 3:
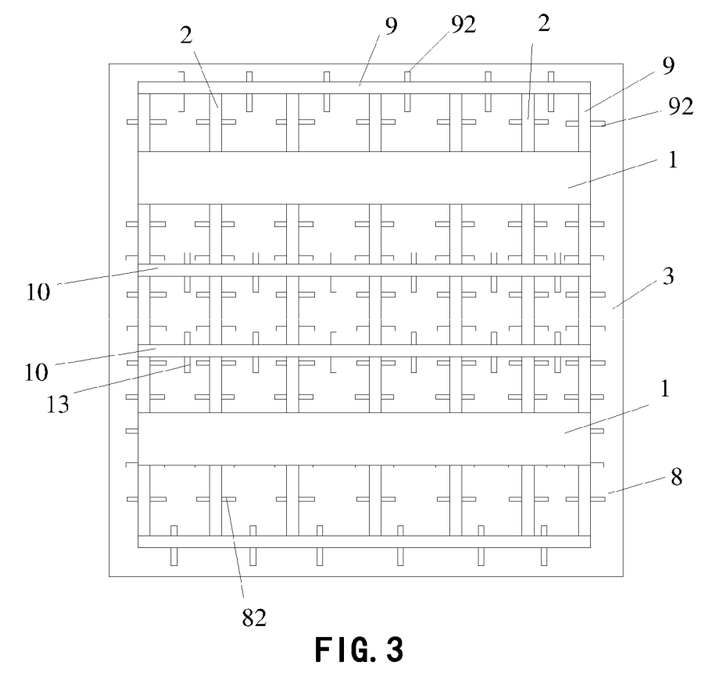
FIG. 3 is a schematic view of a second embodiment of a rear surface structure of a bifacial P-type PERC solar cell according to the present disclosure.
Figure 4:
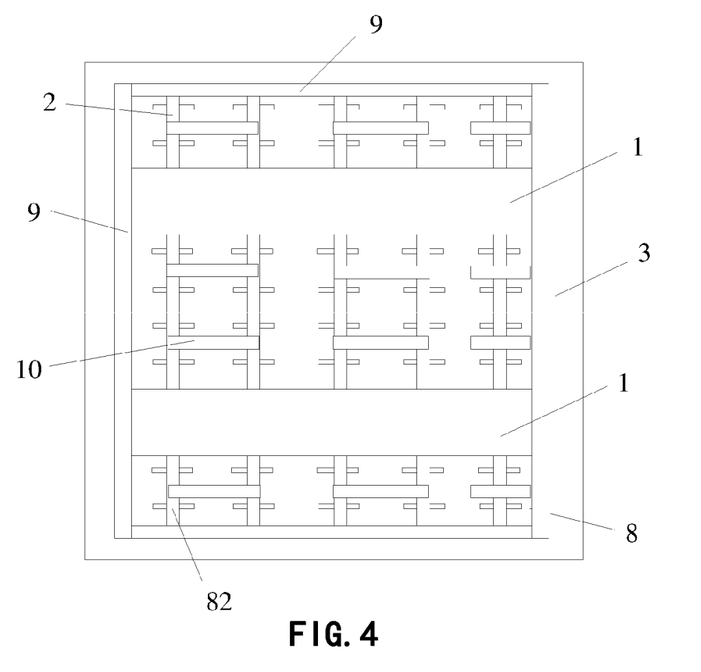
FIG. 4 is a schematic view of a third embodiment of a rear surface structure of a bifacial P-type PERC solar cell according to the present disclosure.
Figure 5:
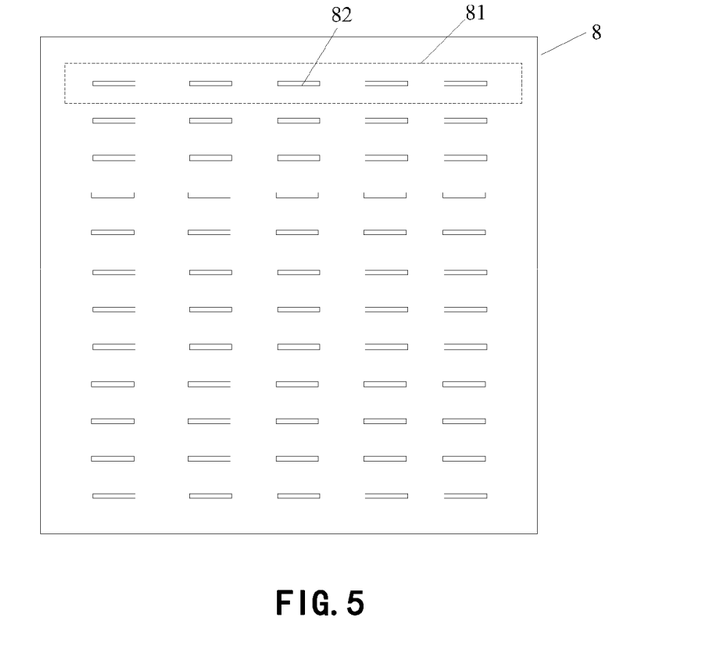
FIG. 5 is a schematic view of an embodiment of a first laser grooving region of a bifacial P-type PERC solar cell according to the present disclosure.
Figure 6:
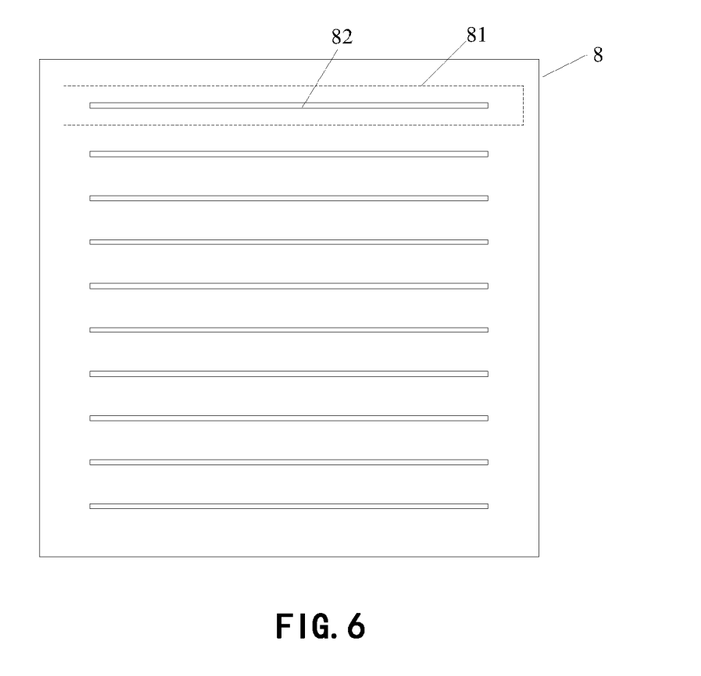
FIG. 6 is a schematic view of another embodiment of a first laser grooving region of a bifacial P-type PERC solar cell according to the present disclosure.

As shown in FIGS. 2, 3 and 4, the first laser grooving region 8 includes a plurality of sets of first laser grooving units 81 arranged horizontally, wherein each set of first laser grooving units 81 includes one or more first laser grooving bodies 82 arranged horizontally. The rear aluminum grid line 2 is perpendicular to the first laser grooving body 82. Referring to FIGS. 5 and 6, the dashed box shown in FIGS. 5 and 6 indicates the first laser grooving unit 81, and each set of first laser grooving unit 81 includes one or more first laser grooving bodies 82 arranged horizontally.

During printing, due to a high viscosity of the aluminum paste and a narrow line width of the printing screen, a broken aluminum grid line occurs occasionally. The broken aluminum grid line would lead to a black broken grid line in an image of EL test. Meanwhile, the broken aluminum grid line will also affect the photoelectric conversion efficiency of the cell. For this reason, in the present disclosure, the grid line backbones 10 are additionally provided at the rear aluminum grid lines 2, and the outer aluminum grid frame 9 is disposed around the rear aluminum grid lines 2. The outer aluminum grid frame 9 is connected with the rear aluminum grid lines 2 and the rear silver electrode 1, and the grid line backbones 10 are connected with the rear aluminum grid lines 2. Thereby, a plurality of paths are additionally provided for the flow of electrons, thus preventing the broken aluminum grid from affecting the photoelectric conversion efficiency of the cells, and meanwhile avoiding the broken grid in the EL test of the cells. Preferably, the grid line backbones 10 are perpendicularly connected with the rear aluminum grid lines 2. It should be noted that the grid line backbones 10 may also be connected with the rear aluminum grid lines 2 at a certain inclination angle, for example, 15°, 30°, 45°, and 60°, not limited thereto.

Referring to the first embodiment of the rear surface structure shown in FIG. 3, a second laser grooving region 90 may be disposed below the outer aluminum grid frame 9, and a third laser grooving region 11 may be disposed below the grid line backbone 10. Referring to the second embodiment of the rear surface structure shown in FIG. 2, the second laser grooving region 90 may also not be disposed below the outer aluminum grid frame 9, and the third laser grooving region 11 may also not be disposed below the grid line backbone 10.

A pattern of the grid line backbone is a continuous straight line or a dashed line composed of a plurality of line segments. The grid line backbone 10 as shown in FIGS. 2 and 3 is a continuous straight line, and the grid line backbone 10 as shown in FIG. 4 is a dashed line composed of a plurality of line segments.

Figure 7:
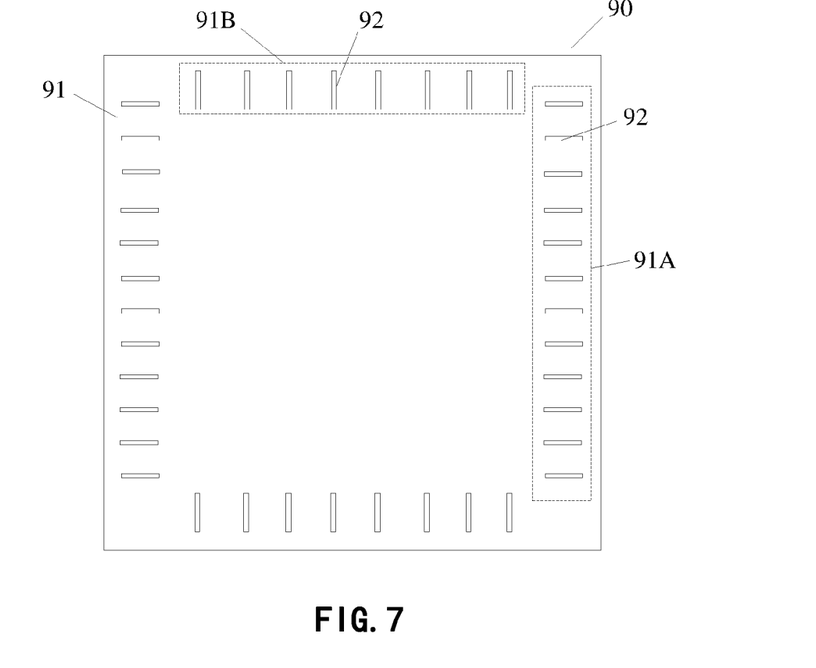
FIG. 7 is a schematic view of a second laser grooving region of a bifacial P-type PERC solar cell according to the present disclosure.

If the second laser grooving region 90 is present, the second laser grooving region 90 includes second laser grooving units 91 arranged vertically or horizontally, wherein each set of second laser grooving units 91 include one or more second laser grooving bodies 92 arranged vertically or horizontally, and the outer aluminum grid frame 9 is perpendicular to the second laser grooving bodies 92. Referring specifically to FIG. 7, the second laser grooving region 90 comprises two second laser grooving units 91A arranged vertically and two second laser grooving units 91B arranged horizontally, the vertically-arranged second laser grooving units 91A each include a plurality of second laser grooving bodies 92 arranged horizontally, and the horizontally-arranged second laser grooving units 91B each include a plurality of second laser grooving bodies 92 arranged vertically.

If the second laser grooving region 90 is present, it is unnecessary to precisely align the aluminum paste with the second laser grooving region, which simplifies the laser and printing processes and lowers the difficulty in debugging the printing device. In addition, the second laser grooving region outside the region covered by the aluminum paste can increase sunlight absorption at the rear surface of the cell and boost the photoelectric conversion efficiency of the cell.

Figure 8:
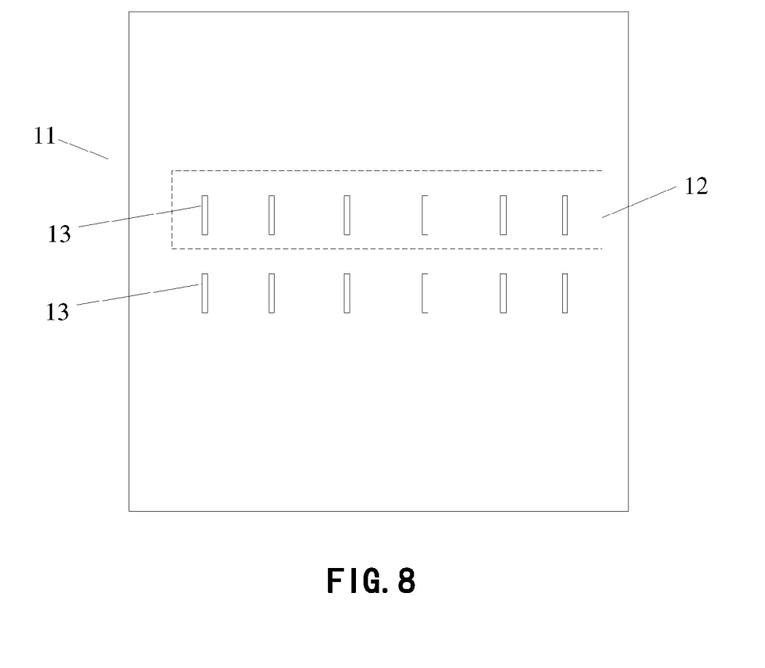
FIG. 8 is a schematic view of a third laser grooving region of a bifacial P-type PERC solar cell according to the present disclosure.

If the third laser grooving region 11 may be disposed below the grid line backbone 10, as shown in FIG. 8, the third laser grooving region 11 includes a plurality of sets of third laser grooving units 12, each set of third laser grooving units 12 includes one or more third laser grooving bodies 13 arranged vertically, the third laser grooving bodies 13 are perpendicular to the grid line backbone 10, and the grid line backbone 10 is connected with the P-type silicon via the third laser grooving bodies 13.

If the third laser grooving region 11 is disposed below the grid line backbone 10, it is unnecessary to perform precise alignment of the paste and the third laser grooving region 11, which simplifies the laser process and the printing process and lowers the difficulty in debugging the printing device. Furthermore, the third laser grooving region 11 that is not covered by the paste can increase sunlight absorption at the rear surface of the cells, and thus improve the photoelectric conversion efficiency of the cells.

Preferably, the number of grid line backbones 10 is 30-500; the grid line backbones 10 each have a width of 30-500 µm which is smaller than the length of each of the third laser grooving bodies 13. In the case that the grid line backbones 10 are perpendicular to the third laser grooving bodies 13, the printing problem of the grid line backbones 10 may be facilitated extremely. Without precise alignment, the grid line backbones 10 may all fall within the third laser grooving region 11, which simplifies the laser process and the printing process, lowers the difficulty in debugging the printing device, and is easy to scale-up for industrial production.

The grid line backbones 10 may be made of either silver paste or aluminum paste. If the grid line backbones 10 are made of silver paste, they each have a width of 30-60 µm; if the grid line backbones 10 are made of aluminum paste, they each have a width of 50-500 µm It should be noted that the first laser grooving unit 81 could have various implementations, including:

(1) Each set of first laser grooving units 81 includes one first laser grooving body 82 arranged horizontally, where the first laser grooving unit 81 is a continuous linear grooving region as shown specifically in FIG. 6. The plurality of first laser grooving units 81 are arranged in a vertical direction.

(2) Each set of first laser grooving units 81 includes a plurality of first laser grooving bodies 82 arranged horizontally, where the first laser grooving unit 81 is a non-continuous, line-segment-type linear grooving region as specifically shown in FIG. 5. The plurality of first laser grooving bodies 82 may be two, three, four or more first laser grooving bodies 82, but are not limited thereto. The plurality of first laser grooving units 81 are arranged in a vertical direction.

If each set of the first laser grooving units 81 includes a plurality of first laser grooving bodies 82 arranged horizontally, there are the following several cases:

A. The plurality of the horizontally-arranged first laser grooving bodies 82 have the same width, length and shape and the unit of their dimensions is in the order of micron. The length may be of 50-5000 micron, but is not limited thereto. It should be noted that the first laser grooving bodies may be in the same horizontal plane, or may be staggered up and down (i.e., not in the same horizontal plane). The topography of the staggered arrangement depends on production needs.

B. The plurality of horizontally-arranged first laser grooving bodies 82 have the same width, length and shape and the unit of their dimensions is in the order of millimeter. The length may be of 5-600 mm, but is not limited thereto. It should be noted that the first laser grooving bodies may be in the same horizontal plane, or may be staggered up and down (i.e., not in the same horizontal plane). The topography of the staggered arrangement depends on production needs.

C. The plurality of horizontally-arranged first laser grooving bodies 82 have different widths, lengths and/or shapes, which can be designed in combination based on the manufacturing requirements. It should be noted that the first laser grooving bodies may be in the same horizontal plane, or may be staggered up and down (i.e., not in the same horizontal plane). The topography of the staggered arrangement depends on production needs.

As a preferred implementation of the present invention, the first laser grooving body has a linear shape to facilitate fabrication, simplify process and lower manufacturing costs. The first laser grooving body also can be configured in other shapes, such as a curved shape, an arc shape, a wavy shape, etc. Its implementations are not limited to the embodiments presented in this invention.

The first laser grooving units are arranged in parallel and the first laser grooving bodies are arranged side by side in each first laser grooving unit, which can simplify the production process and is suitable for mass application.

Spacing between the first laser grooving units is 0.5-50 mm and spacing between the first laser grooving bodies is 0.5-50 mm in each first laser grooving unit.

The first laser grooving body 82 has a length of 50-5000 micron and a width of 10-500 micron. Preferably, the first laser grooving body 82 is 250-1200 micron long and 30-80 micron wide.

The length, width and spacing of the first laser grooving units and the number and width of the aluminum grids are optimized based on the comprehensive consideration of contact area between the aluminum grid and the P-type silicon, shading area of the aluminum grid, and sufficient collection of electrons, with the purpose of reducing the shading area of the rear aluminum grids as much as possible, while ensuring good current output and further boosting the overall photoelectric conversion efficiency of the cell.

The number of the rear aluminum grid lines is 30-500 and each rear aluminum grid line has a width of 30-500 micron, wherein the width of the rear aluminum grid line is much smaller than a length of the first laser grooving body. Preferably, the number of the rear aluminum grid lines is 80-200 and each rear aluminum grid line has a width of 50-300 micron.

The width of the rear aluminum grid line is much smaller than the length of the first laser grooving body, which may greatly facilitate the printing of the rear aluminum grid lines if the aluminum grid is perpendicular to the first laser grooving body. The aluminum grid can be provided within the first laser grooving region without precise alignment, which simplifies the laser and printing processes, lowers the difficulty in debugging the printing device and is easy to scale-up for industrial production.

In the present invention, the rear aluminum grid lines are achieved by forming a first laser grooving region in the rear passivation layer with laser grooving, and then printing the aluminum paste in a direction that is perpendicular to a laser scribing direction, such that the aluminum paste is connected with the P-type silicon via the grooving region. By fabricating the cell grid line structures on the front surface and the rear surface of the silicon wafer, the bifacial PERC solar cell may employ a method different from the conventional one for printing the aluminum paste, without the need of precisely aligning the aluminum paste with the first laser grooving region. Such process is simple and easy to scale-up for industrial production. If the aluminum grid was parallel to the first laser grooving body, it would be necessary to precisely align the aluminum paste with the first laser grooving region, which would put a high demand on the accuracy and repeatability of the printing device. As a result, the yield would be difficult to control and a lot of defective products would be produced, resulting in decreased average photoelectric conversion efficiency. With aid of the present invention, the yield can be boosted to 99.5%.

Furthermore, the rear passivation layer 3 includes an aluminum oxide layer 31 and a silicon nitride layer 32, wherein the aluminum oxide layer 31 is connected with the P-type silicon 4 and the silicon nitride layer 32 is connected with the aluminum oxide layer 31;

The silicon nitride layer 32 has a thickness of 20-500 nm;

The aluminum oxide layer 31 has a thickness of 2-50 nm.

Preferably, the thickness of the silicon nitride layer 32 is 100-200 nm;

The thickness of the aluminum oxide layer 31 is 5-30 nm.

Correspondingly, the present invention also discloses a method of preparing a bifacial P-type PERC solar cell, comprising:

S101: forming textured surfaces at a front surface and a rear surface of a silicon wafer, the silicon wafer being P-type silicon;

S102: performing diffusion on the silicon wafer to form an N-type emitter;

S103: removing phosphosilicate glass on the front surface and peripheral p-n junctions formed during the diffusion;

S104: depositing an aluminum oxide ($Al_2O_3$) film on the rear surface of the silicon wafer;

S105: depositing a silicon nitride film on the rear surface of the silicon wafer;

S106: depositing a silicon nitride film on the front surface of the silicon wafer;

S107: performing laser grooving in the rear surface of the silicon wafer to form a first laser grooving region, wherein the first laser grooving region includes a plurality of sets of first laser grooving units that are horizontally arranged, each set of the first laser grooving units includes one or more first laser grooving bodies that are arranged horizontally;

S108: printing a rear silver busbar electrode on the rear surface of the silicon wafer;

S109: printing aluminum paste in a direction perpendicular to a laser grooving direction on the rear surface of the silicon wafer to obtain rear aluminum grid lines, the rear aluminum grid lines being perpendicular to the first laser grooving bodies, and printing aluminum paste around the rear aluminum grid lines to obtain an outer aluminum grid frame;

S110 printing grid line backbones on the rear surface of the silicon wafer;

S111: printing front electrode paste on the front surface of the silicon wafer;

S112: sintering the silicon wafer at a high temperature to form a rear silver electrode and a front silver electrode;

S113: performing anti-LID annealing on the silicon wafer.

It should be noted that the sequence of S106, S104 and S105 may be changed. S106 may be performed before S104 and S105. In S109, the rear aluminum grid lines and the outer aluminum grid frame may be completed in two steps.

Between S103 and S104, there is also included a step of polishing the rear surface of the silicon wafer. The present invention may be provided with or without the step of polishing the rear surface.

The grid line backbones may be made of silver paste or aluminum paste. If the grid line backbones are made of silver paste, S109 and S110 are two separate steps; if the grid line backbones are made of aluminum paste, S109 and S110 are combined into one step.

Below the grid line backbones may be or may not be provided the second laser grooving region and third laser grooving region. If the second laser grooving region and third laser grooving region are disposed below the grid line backbones, step (7) further includes:

performing laser grooving in the rear surface of the silicon wafer to form the second laser grooving region and third laser grooving region;

wherein the second laser grooving region includes second laser grooving units that are arranged vertically or horizontally, each set of second laser grooving units includes one or more second laser grooving bodies that are arranged vertically or horizontally, and the second laser grooving bodies are perpendicular to the outer aluminum grid frame;

wherein the third laser grooving region includes a plurality of sets of third laser grooving units, each set of third laser grooving units includes one or more third laser grooving bodies arranged vertically, and the third laser grooving bodies are perpendicular to the grid line backbones.

It should also be noted that the specific parameter settings of the first laser grooving region, the third laser grooving region, the rear aluminum grid lines, the grid line backbones and the outer aluminum grid frame in the preparation method are as described above and are thus not be repeated here.

Accordingly, the present invention also discloses a PERC solar cell module, which includes a PERC solar cell and a packaging material, wherein the PERC solar cell is any one of the bifacial P-type PERC solar cells described above. Specifically, as one embodiment of the PERC solar cell module, it is composed of a first high-transmittance tempered glass, a first layer of ethylene-vinyl acetate (EVA) copolymer, a PERC solar cell, a second layer of an ethylene-vinyl acetate (EVA) copolymer, and a second high-transmittance tempered glass which are sequentially connected from top to bottom.

Accordingly, the present invention also discloses a PERC solar system, which includes a PERC solar cell that is any one of the bifacial P-type PERC solar cells described above. As a preferred embodiment of the PERC solar system, it includes a PERC solar cell, a rechargeable battery pack, a charge and discharge controller, an inverter, an AC power distribution cabinet, and a sun-tracking control system. The PERC solar system therein may be provided with or without a rechargeable battery pack, a charge and discharge controller, and an inverter. Those skilled in the art can adopt different settings according to actual needs.

It should be noted that in the PERC solar cell module and the PERC solar system, components other than the bifacial P-type PERC solar cell may be designed with reference to the prior art.

The present invention will be further described with reference to embodiments.

Embodiment 1

(1) forming textured surfaces at a front surface and a rear surface of a silicon wafer, the silicon wafer being P-type silicon;

(2) performing diffusion on the silicon wafer to form an N-type emitter;

(3) removing phosphosilicate glass on the front surface and peripheral p-n junctions formed during the diffusion;

(4) depositing an aluminum oxide ($Al_2O_3$) film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form the first laser grooving region, wherein the first laser grooving region includes a plurality of sets of first laser grooving units that are horizontally arranged, each of the sets of the first laser grooving units includes one or more first laser grooving bodies arranged horizontally, and the laser grooving bodies each have a length of 1000 µm and a width of 40 µm;

(8) printing a rear silver busbar electrode on the rear surface of the silicon wafer;

(9) printing aluminum paste in a direction perpendicular to a laser grooving direction on the rear surface of the silicon wafer to obtain the rear aluminum grid lines, wherein the rear aluminum grid lines are perpendicular to the first laser grooving bodies, the number of the rear aluminum grid lines is 150, and the width of each of the rear aluminum grid lines is 150 µm; and printing aluminum paste around the rear aluminum grid lines to obtain an outer aluminum grid frame which is sized consistent with the rear aluminum grid line;

(10) printing grid line backbones on the rear surface of the silicon wafer, the grid line backbones employing silver paste, being in a number of 140 and having a width of 60 µm;

(11) printing front electrode paste on the front surface of the silicon wafer;

(12) sintering the silicon wafer at a high temperature to form a rear silver electrode and a front silver electrode;

(13) performing anti-LID annealing on the silicon wafer.

Embodiment 2

(1) forming textured surfaces at a front surface and a rear surface of a silicon wafer, the silicon wafer being P-type silicon;

(2) performing diffusion on the silicon wafer to form an N-type emitter;

(3) removing phosphosilicate glass on the front surface and peripheral p-n junctions formed during the diffusion and polishing the rear surface of the silicon wafer;

(4) depositing an aluminum oxide ($Al_2O_3$) film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form a first laser grooving region, a second laser grooving region and a third laser grooving region, wherein the first laser grooving region includes a plurality of sets of horizontally-arranged first laser grooving units, each of the sets of first laser grooving units includes one or more horizontally-arranged first laser grooving bodies, and the first laser grooving bodies each have a length of 500 µm and a width of 50 µm;

wherein the second laser grooving region includes second laser grooving units that are arranged vertically or horizontally, each set of second laser grooving units includes one or more second laser grooving bodies that are arranged vertically or horizontally, the second laser grooving bodies are perpendicular to the outer aluminum grid frame, and the second laser grooving bodies each have a length of 500 µm and a width of 50 µm;

wherein the third laser grooving region includes a plurality of sets of third laser grooving units, each set of third laser grooving units includes one or more third laser grooving bodies arranged vertically, and the third laser grooving bodies each have a length of 500 µm and a width of 50 µm;

(8) printing a rear silver busbar electrode on the rear surface of the silicon wafer;

(9) printing aluminum paste in a direction perpendicular to a laser grooving direction on the rear surface of the silicon wafer to obtain the rear aluminum grid lines, wherein the rear aluminum grid lines are perpendicular to the first laser grooving bodies; the number of the rear aluminum grid lines is 200, and the width of each of the rear aluminum grid lines is 200 µm; and printing aluminum paste around the rear aluminum grid lines to obtain an outer aluminum grid frame which is sized consistent with the rear aluminum grid line, the outer aluminum grid frame being perpendicular to the second laser grooving bodies;

(10) printing grid line backbones on the rear surface of the silicon wafer, the grid line backbones employing silver paste, being in a number of 190 and having a width of 50 µm, the grid line backbones being perpendicular to the third laser grooving bodies;

(11) printing front electrode paste on the front surface of the silicon wafer;

(12) sintering the silicon wafer at a high temperature to form a rear silver electrode and a front silver electrode;

(13) performing anti-LID annealing on the silicon wafer.

Embodiment 3

(1) forming textured surfaces at a front surface and a rear surface of a silicon wafer, the silicon wafer being P-type silicon;

(2) performing diffusion on the silicon wafer to form an N-type emitter;

(3) removing phosphosilicate glass on the front surface and peripheral p-n junctions formed during the diffusion;

(4) depositing an aluminum oxide ($Al_2O_3$) film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form a first laser grooving region, wherein the first laser grooving region includes a plurality of sets of horizontally-arranged first laser grooving units, each of the sets of first laser grooving units includes one or more horizontally-arranged first laser grooving bodies, and the first laser grooving bodies each have a length of 300 µm and a width of 30 µm;

(8) printing a rear silver busbar electrode on the rear surface of the silicon wafer;

(9) printing aluminum paste in a direction perpendicular to a laser grooving direction on the rear surface of the silicon wafer to obtain rear aluminum grid lines, printing grid line backbones in a direction perpendicular to the rear aluminum grid lines, the grid line backbones employing aluminum paste, the rear aluminum grid lines being perpendicular to the first laser grooving bodies, the number of the rear aluminum grid lines being 250, the width of each of the rear aluminum grid lines being 250 µm, the number of the backbones being 240, the width of each of the backbones being 100 µm; and printing aluminum paste around the rear aluminum grid lines to obtain an outer aluminum grid frame which is sized consistent with the rear aluminum grid line;

(10) printing front electrode paste on the front surface of the silicon wafer;

(11) sintering the silicon wafer at a high temperature to form a rear silver electrode and a front silver electrode;

(12) performing anti-LID annealing on the silicon wafer.

Embodiment 4

(1) forming textured surfaces at a front surface and a rear surface of a silicon wafer, the silicon wafer being P-type silicon;

(2) performing diffusion on the silicon wafer to form an N-type emitter;

(3) removing phosphosilicate glass on the front surface and peripheral p-n junctions formed during the diffusion and polishing the rear surface of the silicon wafer;

(4) depositing an aluminum oxide ($Al_2O_3$) film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form a first laser grooving region, a second laser grooving region and a third laser grooving region, wherein the first laser grooving region includes a plurality of sets of horizontally-arranged first laser grooving units, each of the sets of first laser grooving units includes one or more horizontally-arranged first laser grooving bodies, and the first laser grooving bodies each have a length of 1200 µm and a width of 200 µm;

wherein the second laser grooving region includes second laser grooving units that are arranged vertically or horizontally, each set of second laser grooving units includes one or more second laser grooving bodies that are arranged vertically or horizontally, the second laser grooving bodies are perpendicular to the outer aluminum grid frame, and the second laser grooving bodies each have a length of 1200 µm and a width of 200 µm;

wherein the third laser grooving region includes a plurality of sets of third laser grooving regions, each set of third laser grooving units includes one or more third laser grooving bodies arranged vertically, and the third laser grooving bodies each have a length of 1200 µm and a width of 200 µm;

(8) printing a rear silver busbar electrode on the rear surface of the silicon wafer;

(9) printing aluminum paste in a direction perpendicular to a laser grooving direction on the rear surface of the silicon wafer to obtain the rear aluminum grid lines; printing grid line backbones in a direction perpendicular to the rear aluminum grid lines; and printing an outer aluminum grid frame around the rear aluminum grid lines, the grid line backbones employing aluminum paste, the rear aluminum grid lines being perpendicular to the first laser grooving bodies, the outer aluminum grid frame being sized consistent with the rear aluminum grid line, the outer aluminum grid frame being perpendicular to the second laser grooving bodies, the grid line backbones being perpendicular to the third laser grooving bodies, the number of the rear aluminum grid lines being 300, the width of each of the rear aluminum grid lines being 300 µm, the number of the backbones being 280, the width of each of the backbones being 200 µm;

(10) printing front electrode paste on the front surface of the silicon wafer;

(11) sintering the silicon wafer at a high temperature to form a rear silver electrode and a front silver electrode;

(12) performing anti-LID annealing on the silicon wafer.

Finally, it should be noted that the above embodiments are only intended to illustrate the technical solutions of the present invention and are not intended to limit the protection scope of the present invention. Although the present invention has been described in detail with reference to the preferred embodiments, it should be appreciated by those skilled in the art that the technical solutions of the present invention may be modified or equivalently substituted without departing from the spirit and scope of the technical solutions of the present invention.

What is claimed is:

1. A bifacial P-type PERC solar cell, comprising:
sequentially, a rear silver electrode, rear aluminum grid lines, a rear passivation layer, a P-type silicon substrate, an N-type emitter, a front silicon nitride film and a front silver electrode, the rear silver electrode being perpendicularly connected with the rear aluminum grid lines;

grid line backbones disposed on the rear aluminum grid lines, the grid line backbones being connected with the rear aluminum grid lines;

an outer aluminum grid frame disposed around the rear aluminum grid lines, the outer aluminum grid frame being connected with the rear aluminum grid lines and the rear silver electrode; and a first laser grooving region being formed in the rear passivation layer by laser grooving, the rear aluminum grid lines being connected to the P-type silicon substrate via the first laser grooving region, the first laser grooving region including a plurality of sets of first laser grooving units arranged horizontally, each of the sets of first laser grooving units includes one or more first laser grooving bodies arranged horizontally, and the rear aluminum grid lines are perpendicular to the first laser grooving bodies;

a second laser grooving region disposed below the outer aluminum grid frame, the second laser grooving region including second laser grooving units that are arranged vertically or horizontally, each set of second laser grooving units including one or more second laser grooving bodies that are arranged vertically or horizontally, and the outer aluminum grid frame being perpendicular to the second laser grooving bodies; and a third laser grooving region disposed below the grid line backbones, the third laser grooving region including a plurality of sets of third laser grooving units, each of the sets of third laser grooving units including one or more third laser grooving bodies arranged vertically, the third laser grooving bodies being perpendicular to the grid line backbones, and the grid line backbones being connected to the P-type silicon via the third laser grooving bodies; and wherein the grid line backbones are perpendicularly connected with the rear aluminum grid lines;

wherein the first laser grooving units are arranged in parallel;

wherein in each of the first laser grooving units, the first laser groove bodies are arranged side by side, in a same horizontal plane or staggered up and down; and wherein a spacing between the first laser grooving units is 0.5-50 mm, in each of the first laser grooving units, a spacing between the first laser grooving bodies is 0.5-50 mm, and the first laser grooving bodies each have a length of 50-5000 μm and a width of 10-500 μm.

2. The bifacial P-type PERC solar cell according to claim 1, wherein a number of the rear aluminum grid lines is 30-500, and a number of the grid line backbones is 30-500;

the rear aluminum grid lines each have a width of 30-500 μm, which is smaller than the length of each of the first laser grooving bodies;

the grid line backbones each have a width of 30-500 μm, which is smaller than a length of each of the third laser grooving bodies.

3. The bifacial P-type PERC solar cell according to claim 2, wherein a pattern of each of the grid line backbones is a continuous straight line or a dashed line composed of a plurality of line segments;

the grid line backbones are made of silver paste and each have a width of 30-60 μm; or the grid line backbones are made of aluminum paste and each have a width of 50-500 μm.

4. A method of preparing a bifacial P-type PERC solar cell, the bifacial P-type PERC solar cell including:

sequentially, a rear silver electrode, rear aluminum grid lines, a rear passivation layer, a P-type silicon substrate, an N-type emitter, a front silicon nitride film and a front silver electrode, the rear silver electrode being perpendicularly connected with the rear aluminum grid lines;

grid line backbones disposed on the rear aluminum grid lines, the grid line backbones being connected with the rear aluminum grid lines;

an outer aluminum grid frame disposed around the rear aluminum grid lines, the outer aluminum grid frame being connected with the rear aluminum grid lines and the rear silver electrode; and a first laser grooving region being formed in the rear passivation layer by laser grooving, the rear aluminum grid lines being connected to the P-type silicon substrate via the first laser grooving region, the first laser grooving region including a plurality of sets of first laser grooving units arranged horizontally, each of the sets of first laser grooving units includes one or more first laser grooving bodies arranged horizontally, and the rear aluminum grid lines are perpendicular to the first laser grooving bodies;

a second laser grooving region disposed below the outer aluminum grid frame, the second laser grooving region including second laser grooving units that are arranged vertically or horizontally, each set of second laser grooving units including one or more second laser grooving bodies that are arranged vertically or horizontally, and the outer aluminum grid frame being perpendicular to the second laser grooving bodies; and a third laser grooving region disposed below the grid line backbones, the third laser grooving region including a plurality of sets of third laser grooving units, each of the sets of third laser grooving units including one or more third laser grooving bodies arranged vertically, the third laser grooving bodies being perpendicular to the grid line backbones, and the grid line backbones being connected to the P-type silicon via the third laser grooving bodies; and wherein the grid line backbones are perpendicularly connected with the rear aluminum grid lines;

wherein the first laser grooving units are arranged in parallel;

wherein in each of the first laser grooving units, the first laser groove bodies are arranged side by side, in a same horizontal plane or staggered up and down; and wherein a spacing between the first laser grooving units is 0.5-50 mm, in each of the first laser grooving units, a spacing between the first laser grooving bodies is 0.5-50 mm, and the first laser grooving bodies each have a length of 50-500 μm and a width of 10-500 μm; and the method comprising:

(1) forming textured surfaces at a front surface and a rear surface of a silicon wafer, the silicon wafer being a P-type silicon;

(2) performing diffusion on the silicon wafer to form an N-type emitter;

(3) removing phosphosilicate glass on the front surface and peripheral p-n junctions formed during the diffusion;

(4) depositing an aluminum oxide film on the rear surface of the silicon wafer;

(5) depositing a silicon nitride film on the rear surface of the silicon wafer;

(6) depositing a silicon nitride film on the front surface of the silicon wafer;

(7) performing laser grooving in the rear surface of the silicon wafer to form a first laser grooving region, wherein the first laser grooving region includes a plurality of sets of first laser grooving units horizontally arranged, and each of the sets of the first laser grooving units includes one or more first laser grooving bodies arranged horizontally;

(8) printing a rear silver busbar electrode on the rear surface of the silicon wafer;

(9) printing aluminum paste in a direction perpendicular to a laser grooving direction on the rear surface of the silicon wafer to obtain rear aluminum grid lines, the rear aluminum grid lines being perpendicular to the first laser grooving bodies, and printing aluminum paste around the rear aluminum grid lines to obtain outer aluminum grid frame;

(10) printing grid line backbones on the rear surface of the silicon wafer;

(11) printing front electrode paste on the front surface of the silicon wafer;

(12) sintering the silicon wafer at a high temperature to form a rear silver electrode and a front silver electrode;

(13) performing anti-LID annealing on the silicon wafer.

5. The method of preparing the bifacial P-type PERC solar cell according to claim 4, further comprising, after the act (3) and before the act (4), polishing the rear surface of the silicon wafer.

6. The method of preparing the bifacial P-type PERC solar cell according to claim 5, wherein the act (7) further comprises:

performing laser grooving in the rear surface of the silicon wafer to form a second laser grooving region and a third laser grooving region;

wherein the second laser grooving region includes second laser grooving units that are arranged vertically or horizontally, each set of second laser grooving units includes one or more second laser grooving bodies that are arranged vertically or horizontally; and the second laser grooving bodies are perpendicular to the outer aluminum grid frame;

wherein the third laser grooving region includes a plurality of sets of third laser grooving units, each of the sets of third laser grooving units includes one or more third laser grooving bodies arranged vertically, and the third laser grooving bodies are perpendicular to the grid line backbones.

7. A PERC solar cell module, comprising a PERC solar cell and a packaging material, wherein the PERC solar cell is a bifacial P-type PERC solar cell and includes:

sequentially, a rear silver electrode, rear aluminum grid lines, a rear passivation layer, a P-type silicon substrate, an N-type emitter, a front silicon nitride film and a front silver electrode, the rear silver electrode being perpendicularly connected with the rear aluminum grid lines;

grid line backbones disposed on the rear aluminum grid lines, the grid line backbones being connected with the rear aluminum grid lines;

an outer aluminum grid frame disposed around the rear aluminum grid lines, the outer aluminum grid frame being connected with the rear aluminum grid lines and the rear silver electrode; and a first laser grooving region being formed in the rear passivation layer by laser grooving, the rear aluminum grid lines being connected to the P-type silicon substrate via the first laser grooving region, the first laser grooving region including a plurality of sets of first laser grooving units arranged horizontally, each of the sets of first laser grooving units includes one or more first laser grooving bodies arranged horizontally, and the rear aluminum grid lines are perpendicular to the first laser grooving bodies;

a second laser grooving region disposed below the outer aluminum grid frame, the second laser grooving region including second laser grooving units that are arranged vertically or horizontally, each set of second laser grooving units including one or more second laser grooving bodies that are arranged vertically or horizontally, and the outer aluminum grid frame being perpendicular to the second laser grooving bodies; and a third laser grooving region disposed below the grid line backbones, the third laser grooving region including a plurality of sets of third laser grooving units, each of the sets of third laser grooving units including one or more third laser grooving bodies arranged vertically, the third laser grooving bodies being perpendicular to the grid line backbones, and the grid line backbones being connected to the P-type silicon via the third laser grooving bodies; and wherein the grid line backbones are perpendicularly connected with the rear aluminum grid lines;

wherein the first laser grooving units are arranged in parallel;

wherein in each of the first laser grooving units, the first laser groove bodies are arranged side by side, in a same horizontal plane or staggered up and down; and wherein a spacing between the first laser grooving units is 0.5-50 mm, in each of the first laser grooving units, a spacing between the first laser grooving bodies is 0.5-50 mm, and the first laser grooving bodies each have a length of 50-5000 μm and a width of 10-500 μm.

\* \* \* \* \*